United States Patent [19]

Sato et al.

[11] 4,051,508

[45] Sept. 27, 1977

[54] SEMICONDUCTOR DEVICE HAVING MULTISTEPPED BUMP TERMINAL ELECTRODES

[75] Inventors: Susumu Sato; Hideo Tsunemitsu, both of Tokyo, Japan

[73] Assignee: Nippon Electric Company, Ltd., Tokyo, Japan

[21] Appl. No.: 694,358

[22] Filed: June 9, 1976

[30] Foreign Application Priority Data

June 13, 1975  Japan ................... 50-71748

[51] Int. Cl.² ............ H01L 23/48; H01L 29/46; H01L 29/54
[52] U.S. Cl. ...................... 357/71; 357/65; 357/68; 357/69
[58] Field of Search ............... 357/65, 67, 68, 69, 357/70, 71

[56] References Cited

U.S. PATENT DOCUMENTS

| 3,442,012 | 5/1969 | Murray | 357/71 |
| 3,501,681 | 3/1970 | Weir | 357/71 |
| 3,514,379 | 5/1970 | Neill | 357/71 |
| 3,585,461 | 6/1971 | Eynon | 357/71 |
| 3,617,818 | 11/1971 | Fuller | 357/71 |
| 3,751,292 | 8/1973 | Kongable | 357/69 |
| 3,765,970 | 10/1973 | Athanas et al. | 357/69 |
| 3,942,187 | 3/1976 | Gelsing et al. | 357/69 |

*Primary Examiner*—Andrew J. James
*Attorney, Agent, or Firm*—Hopgood, Calimafde, Kalil, Blaustein & Lieberman

[57] ABSTRACT

A terminal electrode for a semiconductor device includes a bump terminal comprising first, second, and third metal layers producing a step-like profile. The bump terminal is characterized by improved mechanical strength for gang bonding.

8 Claims, 13 Drawing Figures

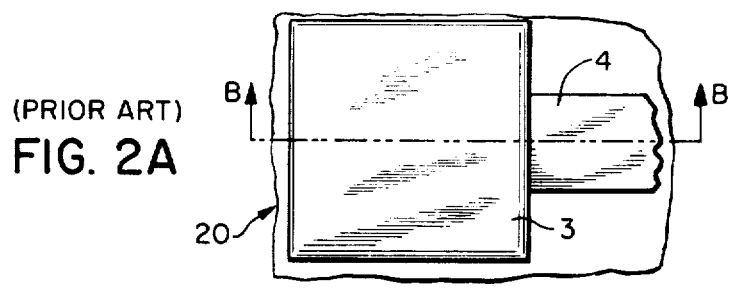
(PRIOR ART)
FIG. 2A
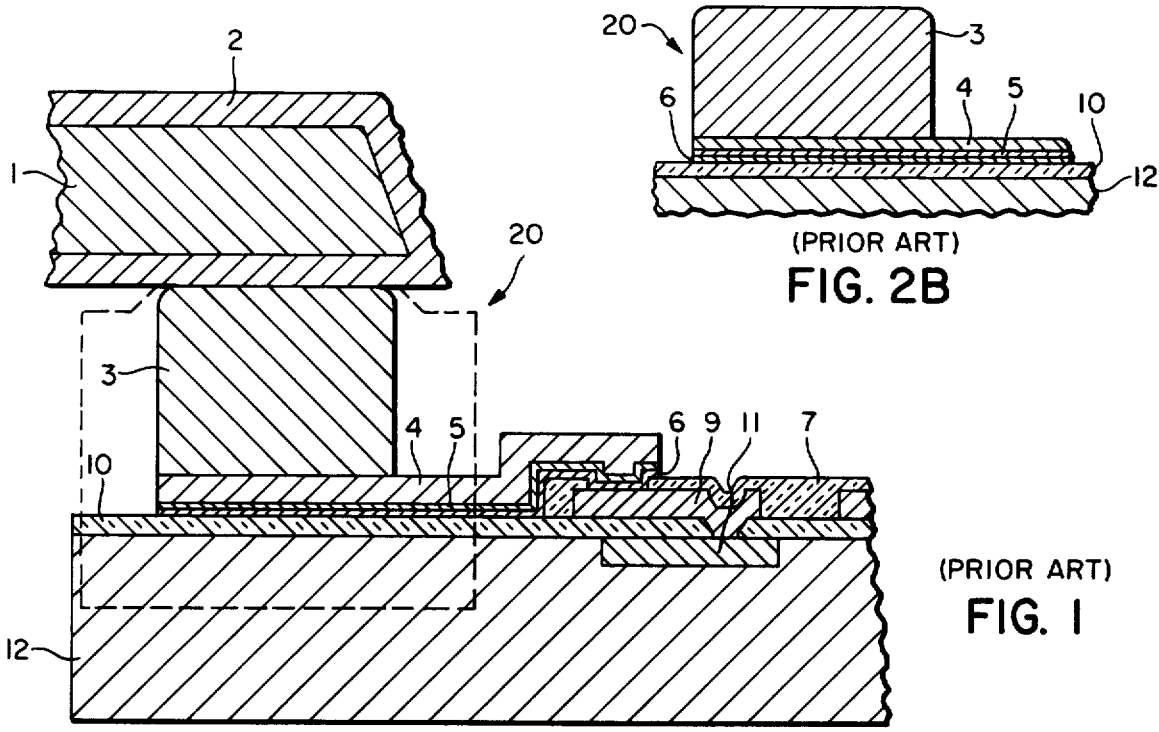
(PRIOR ART)
FIG. 2B
(PRIOR ART)
FIG. 1
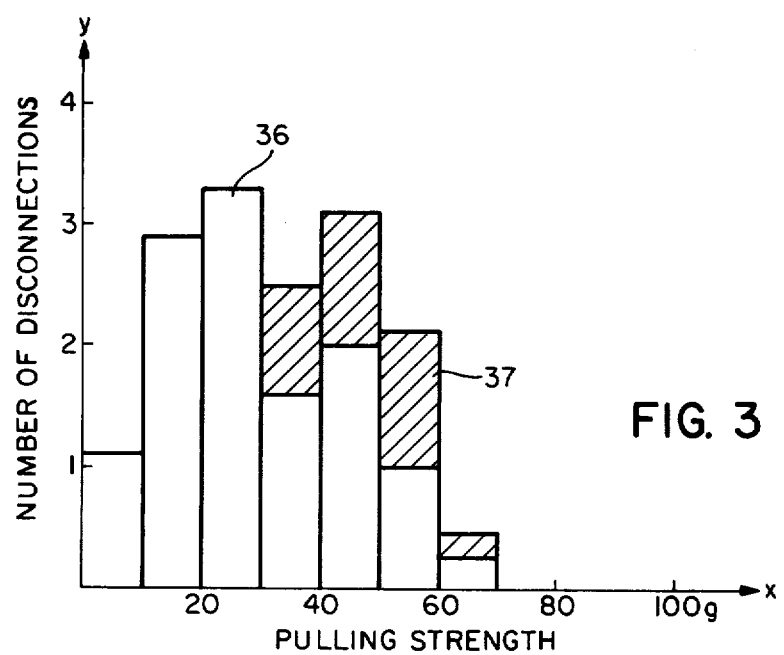
FIG. 3

SEMICONDUCTOR DEVICE HAVING MULTISTEPPED BUMP TERMINAL ELECTRODES

The present invention relates to a semiconductor device having metallic terminal electrodes to which metallic connecting leads are to be bonded.

For making electrical connection of connecting leads with metallic terminal electrodes on a semiconductor device, various new methods have been proposed in place of the conventional wire bonding. One recent technique that has been proposed for LSI application is gang bonding in which connecting leads are prepared from a stripe of metal foil on a plastic tape, with their end portions thinly formed to be directly and simultaneously bonded to metallic protrusions (bumps) at IC terminal electrodes. A gang bonding method of this type is described, for example, in U.S. Pat. No. 3,763,404.

In the standard semiconductor technology for gang bonding, the interconnections and terminal electrodes are formed with aluminum, while the bumps are constructed with gold. But the formation of gold bumps immediately upon the aluminum terminal electrodes eventually causes poor adhesion and vulnerable metallic compound formation (purple plague) between the two metals. Therefore, it is a common practice to interpose a refractory metal between the aluminum and gold to solve these problems. The improved structure, however, still often produces the purple plague: the intermediate refractory metal layer is broken at some spots due to bonding pressure acting on the soft underlying aluminum. In an attempt to eliminate this failure, it has been proposed to form gold bumps on extended lead-outs of rigid metals instead of on the aluminum terminal electrodes. As metals for extended lead-outs, a combination of Ti-Pt-Au has proven suitable for improved mechanical strength and good conductivity.

Corresponding to the gold bump structure for gang bonding, connecting leads are now widely produced using tin-plated copper. This material selection is due to the fact that gold-tin eutectic can be obtained at a low bonding pressure under a relatively low temperature. As a result, satisfactory mechanical bonding can be obtained with no failures using the above-described gold bump structure and tin-plated copper leads. The leads of this type, however, often present oxidation, corrosion and whisker formation under some operating conditions. Of these problems, tin whisker formation, induced by a large electric current flow or under a high temperature condition, is the most serious: single crystalline tin whiskers grow to bridge separate conductive areas, which can result in an electrical short circuit. The addition of a small amount of lead (Pb) to tin and some other methods have been found to be effective in decreasing the whisker appearance but not a complete extent. In short, tin-plated copper leads are defective in electrochemical quality and must be replaced by some other stable material. In this respect, gold-plated copper leads are apparently a logical choice for this purpose, as they show no chemical degradation or whisker formation. It has been revealed, however, that gold-plated copper leads require a greater bonding pressure to have satisfactory mechanical connecting with the gold bump in comparison with tinplated copper leads. This difference in bonding seems to derive from the fact that gold-gold bonding is based on the plastic deformation of metal while tin-gold bonding is based on eutectic alloy formation. As a result of the greater bonding pressure required for gold-gold bondage such as 1200Kg/cm² or more at, for example, a temperature of 300° C, mechanical cracks often appear in the silicon substrate beneath the gold bumps. Furthermore, in the case of gang bonding for an LSI structure, which has ordinarily more than several tens of bonding spots, a bonding pressure can not possibly be applied uniformly to all these spots, due to a variation in the thickness of the gold bumps and of gold-plated leads. Consequently, a pressure of the more than the average value may act on some bonding spots, and accordingly destruct the silicon substrate conspicuously beneath these bumps. Therefore, the first requirement for a reliable gold-gold gang bonding is the complete elimination of apparent silicon cracks.

Secondly, in a gang bonding method, in addition to bonding between connecting leads and terminal electrodes (inner lead bondings), another bonding is ordinarily necessary to bond the connecting leads to external leads on an outer case or on a ceramic substrate (outer lead bonding). Prior to this outer lead bonding, cutting, bending and plastic coating are to be conducted to the connecting leads. Therefore, the inner lead bonding strength must desirably be large enough to withstand the above-mentioned mechanical treatments ($\geq 20$g).

The third requirement for a reliable bonding is the complete elimination of potential silicon crack failures, which reveal themselves under a thermal stress of some operating condition, even if the inner lead bondage satisfies the first and second requirements. This kind of failure can be detected by the intentional destruction of bondage by a pull-off stress. By this simple test, disconnection occurs at four different portions: at the connecting lead, at the lead-bump interface, at the bumb-substrate interface, and at the silicon substrate. Of these four failure modes, the first one indicates a satisfactory bonding, and the second and the third modes indicate poor bonding of the bump with the lead and poor adhesion of the bump with the substrate, respectively. And the fourth mode, i.e. the appearance of silicon cracks as a result of intentional pull-off stress of more than 20g, corresponds to a potentional silicon crack. The present invention successfully satisfies all these three requirements.

One object of the present invention is to offer a semiconductor device with new bump terminals which have an improved mechanical strength for gang bonding.

Another object of the present invention is to offer a semiconductor device having new bump terminals with an excellent and reliable combination with a gold connecting lead.

These and other objects, features and advantages of this invention will be better understood from the following detailed description, taken in conjunction with the accompanying drawings, in which:

FIG. 1 is a cross-sectional view showing a semiconductor device with a bump terminal which is in bondage with a connecting lead;

FIG. 2A is an enlarged plan view of a conventional bump structure, and FIG. 2B is a cross sectional view across the line B-B of FIG. 2A;

FIG. 3 is a graph showing the results of the intentional pull-off test for a lead bonding to the conventional bump structure illustrated in FIGS. 2A and 2B;

FIG. 5 is an example of a bump structure according to the present invention, in which

Figure 4A:
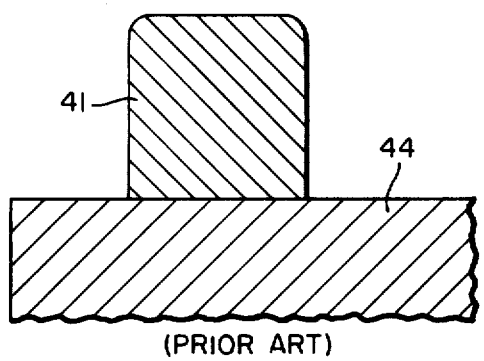
FIGS. 4A, 4B and 4C are schematic cross-sectional views of bump structures of the conventional type and for two stress-decentrated types.

The semiconductor integrated circuit device with the bump terminal structure, illustrated in FIG. 1, includes a main portion of a copper connecting lead 1, a surface coating 2 of plated gold layer on the copper connecting lead; a conventional gold bump 3; Au, Pt, layers 4,5, and 6 for an extended lead-out; a $SiO_2$ layer 7 for insulation of the different metallic layers; aluminum interconnections 9; a $SiO_2$ layer 10 for surface passivation; an impurity - diffused area 11; and a Si substrate 12 including circuit elements such as a transistor and resistor. A portion 20 including the bump terminal of the device of FIG. 1 is shown in FIG. 2. Referring to FIGS. 2A and 2B, a main surface of the substrate 12 is covered with $SiO_2$ layer 10 which is preferably formed by a thermally grown method followed by a chemical vapor deposition method. For a bump construction, at first layer Ti 6 and Pt 5 layer are successively sputtered and delineated to form extended lead-outs. Then, gold layer 4 is plated to a thinner extent (about $2\mu$), for the purpose of increasing the electrical conductivity of the extended lead-outs. Finally a gold bump 3 is formed by thick plating (about $15\mu$). Consequently, a gold bump terminal as shown in FIG. 2 is obtained, where the Ti layer 6, the Pt layer 5 and the gold layer 4 are laminated one to the other with no peripheral margin.

As a next step, a gold-plated copper lead (1 shown in FIG. 1) is attached to gold bump 3, and then a thermocompression stress (1200 kg/cm² at 300° C) is given over the connecting lead on the bump 3.

The bondage strength of this bonding is measured by pulling the lead 1 upward, to an extent of its disconnection, with a tension gauge. A test result is shown in FIG. 3, where the x-axis corresponds to a pulling strength at which disconnecting occurred, and the y-axis corresponds to the number of disconnections. A disconnection mode of silicon cracks 36 is distinguished from the other modes 37. This result shows that most bondages are disconnected with the silicon crack mode. What is worse still, many bondages are weaker than 20 g-strength. Therefore, it can be concluded that this conventional gold bump structure is greatly defective to be bonded with a gold-plated lead and that this conventional bump terminal cannot be used in a gang bonding method.

For a better understanding of this failure situation, a deeper consideration must be given to bonding and stress concentration. It is apparent that an average pressure given to the gold lead surface for bonding (typically 1200 kg/cm² at a temperature of 300° C) does not exceed the compression strength of silicon (~3500 kg/cm²). But a concentrated stress acting on the silicon substrate at the bump periphery seems to exceed it in some cases due to the deformation of the bump structure by bonding operation. Silicon crystal may show destruction (cracks) under these circumstances.

One of the simple methods to reduce the aboved-described concentrated stress is to design the bump surface larger than the bonding area with the connecting lead. This means to reduce the lead width relative to the bump size. Concerning an appropriate bump size, a maximum bump size is ordinarily determined from an economical viewpoint for LSI production. At present, maximum bump sixe is typically $100\mu \times 100\mu$ and the further trend lies in the direction of its reduction. According to our experiments, with a gold bump size fixed at $100\mu \times 100\mu$, for example, a connecting lead width must be reduced to less than $40\mu$ to completely eliminate silicon cracks. Taking into account possible misalignment of a connecting lead to a bump surface at bonding, this value for an appropriate maximum load width should desirably be further reduced. A connecting lead of such a narrow width becomes mechanically very weak. It can be concluded, therefore, that this method is impractical.

Another attempt to achieve stress decentration may be to modify the conventional bump structure so that the concentrated stress is minimized. We have tried and finally found a satisfactory solution.

Figure 4B:
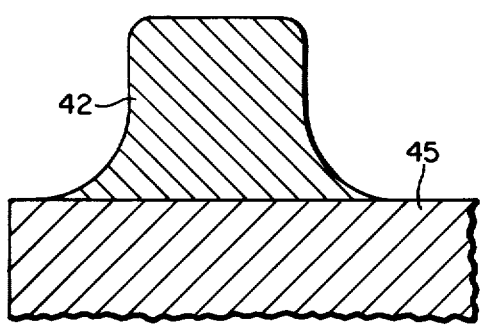
Figure 4C:
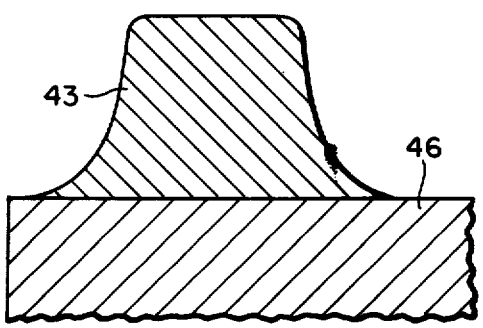

Generally if a bump with a flat top surface is formed on a flat plane, and is subjected to a uniform compression over the entire top surface, the resultant concentration of stress beneath the bump periphery is determined by the shape and material of the bump. Concerning the stress concentration of this situation, it is understood that with the top surface, the bottom interface and the height of the bump fixed, a maximum stress $\sigma$ max acting in the underlying plane decreases as the curvature radius of the the side surface $\gamma$ increases. Referring now to FIGS. 4A, 4B and 4C, the conventional bump 41 and the improved bumps 42 and 43 having curvatures of the side surface $\gamma_b$ and $\gamma_c$, respectively, where $\gamma_b < \gamma_c$, are constructed on substrates 44, 45 and 46. Under these situations, the following relation is observed, $$\sigma_a \max > \sigma_b \max > \sigma_c \max$$

where $\sigma_a$ max, $\sigma_b$ max, and $\sigma_c$ max denote maximum stress acting on the substrate 44, 45 and 46, respectively.

A series of experimental bumps 41, 42 and 43 were constructed on the same type of silicon substrate 44, 45 and 46 on the basis of the above-mentioned principle to find a stress-reduced structure that is compatible with the present technological status.

Figure 5A:
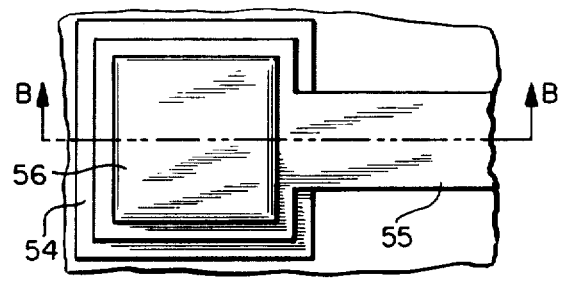
FIG. 5A is a plan view and FIG. 5B is a cross-sectional view across the line B—B of FIG. 5A.
Figure 5B:
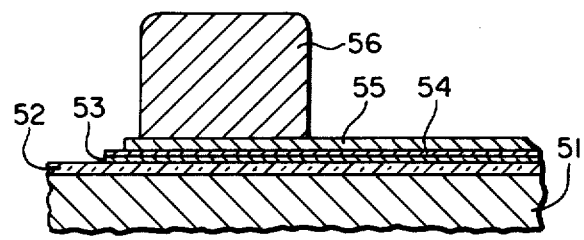

A preferred embodiment of a bump terminal according to the present invention is shown in FIGS. 5A and 5B in which the composition of the metallic material is the same as that described in FIG. 2. But the geometrical structure of the bump terminal of the invention in the vertical direction a two stepping structure formed as an approximation of the curved side face shown in FIG. 4.

An explanation of this embodiment is now made by following a preferred fabrication process in accordance with FIG. 5. First a layer 53 of 1000 A thick titanium and successively that of a 1500 A thick platinum layer 54 is sputtered on the $Si_3N_4$ layer 52 formed on a silicon substrate 51. This double metallic layer positioned on the electrode region is then patterned into $100\mu \times 100\mu$ square shape. After that, the thin gold layer 55 of $2-3\mu$ thick is selectively electroplated to form an $80\mu \times 80\mu$ square extended lead-out terminal. Finally, the thick gold layer of 10–15μ thick is selectively plated to form a 60μ × 60μ square gold bump 56.

Figure 6:
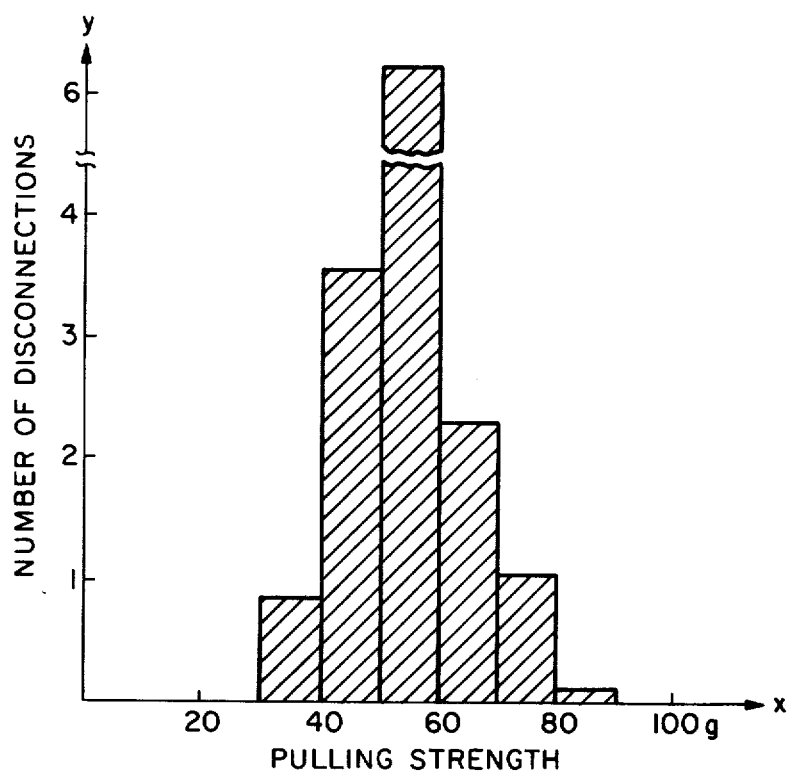
FIG. 6 is a graph showing the results of the intentional pull-off test for a lead bonding to the newly invented bump structure illustrated in FIG. 5.

After the fabrication of this new double stepping structure, the same intentional pull-off test as explained hereinbefore was conducted on the gold-plated copper lead bonded to bump 56. The result of the test shows, as illustrated in FIG. 6, that no silicon crack was observed with any of the tested bump sample. Almost all their disconnection modes are of lead-break and all of their pull-strength resistance are more than 30g. This result clearly manifests a good improvement in bonding strength and reliability in comparison with the conventional structure represented in FIGS. 2A and 2B.

Figure 7A:
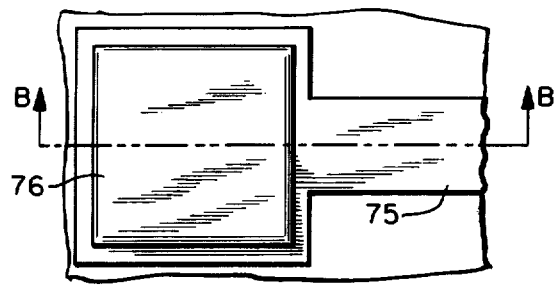
FIG. 7A is a plan view of a modified bump structure.
Figure 7B:
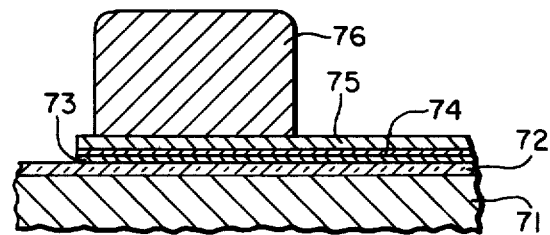
FIG. 7B is a cross-sectional view across the line B—B of FIG. 7A.
Figure 8:
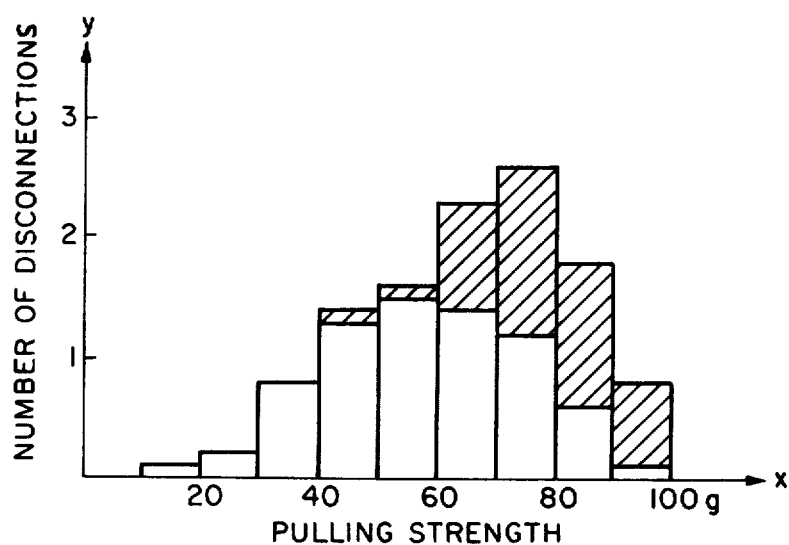
FIG. 8 is a graph showing the results of the intentional pull-off test for a lead bonding to the bump structure described in FIG. 7.

As another approximation of a curved-side bump structure, a single stepping type bump was constructed as in FIG. 7. In this example, the bottom $T_i$-$P_t$-$A_u$ layers 73, 74, and 75 were patterned to a 150μ × 150μ square and the overlying bump 76 was patterned to a 80μ × 80μ square. The result of the intentional pull-off-a-lead test of the bump shown in FIG. 7 is shown in FIG. 8. This indicates that although the one-stepping structure improves the gold-gold bonding reliability; it cannot eliminate Si cracks altogether, even if the stepping margin is designed as wide as 35μ at each side. It may be concluded, therefore, that a stepping bump structure of not less than 2 steps is satisfactory.

Relating to the double stepping structure more specifically, it was found in our experiments that a minimum of 5μ step margin is necessary for each step to assure the favorable effect of the stepping. A maximum step margin of about 25μ is favorable from the points of the tolerable bump size maximum in LSI design and of the required minimum bump size for satisfactory mechanical strength. The thickness of the respective metallic layers and the bump may be 500 to 1,500 angstroms for the titanium layer 53, 1,000 to 3,000 angstroms for the platinum layer 54, 1 to 3 microns for the gold layer 55, and 5 to 30 microns for the gold bump 56.

As described hereinabove, the new bump structure withstands a high compression. Consequently a gold-lead to a gold-bump bonding has been realized without causing any deterioration of the semiconductor device. By replacing the previously employed tin-plated connecting lead with the gold-plated lead, improvement of reliability has been achieved due to the elimination of whisker formation and of corrosion. In short, the new bump structure has enabled reliable bonding between the LSI terminal electrode and the reliable connecting lead.

Although the present explanation has been restricted to gold lead-gold bump combination, it would be apparent that the principle of double stepping bump is also applicable to other metals such as copper bump, and to any other semiconductor devices such as a discrete transistor and a discrete diode as well as to integrated circuit devices.

What is claimed is:

1. A semiconductor device having an improved bump terminal electrode comprising a semiconductor substrate having at least one element and one major surface, an insulator film formed on said major surface, and a bump terminal formed on said insulator film electrically connected through a conductive layer to said element, said bump terminal electrode including a first metal layer, a second metal layer, and a third metal layer of the same material as said second metal layer, said first metal layer being formed on said insulator film and being electrically connected to said conductor layer, said second metal layer being disposed directly on the surface of said first metal layer, said second metal layer not extending beyond said first metal layer, the area of said second metal layer being smaller than that of said first layer, said third metal layer being disposed directly on the surface of said second metal layer, the area of said third metal layer being smaller than that of said second metal layer.

2. A semiconductor device as claimed in claim 1, wherein said material of said second and third metal layers is gold.

3. A semiconductor device as claimed in claim 1, further comprising a metal connecting lead having one end bonded to said bump terminal.

4. A semiconductor device as claimed in claim 3, wherein said metal connecting lead has a surface of gold.

5. The semiconductor device as claimed in claim 1, wherein the distance between the perimeter of said second metal layer and that of said third metal layer is more than 5 microns.

6. The semiconductor device as claimed in claim 1, wherein the distance between the perimeter of said first metal layer and that of said second metal layer is more than 5 microns.

7. The semiconductor device as claimed in claim 1 wherein said first metal layer of the bump terminal electrode is wider than said conductive layer.

8. The semiconductor device as claimed in claim 1 wherein said first metal layer is square as viewed in plan.

* * * * *